(12) United States Patent
Yim et al.

(10) Patent No.: US 8,921,153 B2
(45) Date of Patent: Dec. 30, 2014

(54) ORGANIC LIGHT EMITTING DISPLAY DEVICE AND METHOD OF MANUFACTURING THE SAME

(71) Applicant: Samsung Display Co., Ltd., Yongin, Gyeonggi-do (KR)

(72) Inventors: Sang-Hoon Yim, Yongin (KR); Young-Woo Song, Yongin (KR); Jong-Hyuk Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/041,415

(22) Filed: Sep. 30, 2013

(65) Prior Publication Data

US 2014/0339513 A1 Nov. 20, 2014

(30) Foreign Application Priority Data

May 16, 2013 (KR) .................. 10-2013-0055440

(51) Int. Cl.
*H01L 51/52* (2006.01)
*H01L 27/32* (2006.01)
*H01L 51/56* (2006.01)

(52) U.S. Cl.
CPC ............. *H01L 27/32* (2013.01); *H01L 51/56* (2013.01); *H01L 51/5203* (2013.01)
USPC ............................. 438/99; 257/40

(58) Field of Classification Search
CPC . H01L 27/32; H01L 51/5203; H01L 51/5209; H01L 51/5225; H01L 51/56
USPC ............................................. 257/40; 438/99
See application file for complete search history.

(56) References Cited

U.S. PATENT DOCUMENTS

| 6,911,773 | B2 * | 6/2005 | Seki .............................. 313/506 |
| 7,692,191 | B2 * | 4/2010 | Kwak et al. ..................... 257/59 |
| 8,735,872 | B2 * | 5/2014 | Kim et al. ....................... 257/40 |
| 2002/0187366 | A1 | 12/2002 | Hamada et al. |
| 2005/0264184 | A1 * | 12/2005 | Park et al. ..................... 313/504 |
| 2009/0051270 | A1 | 2/2009 | Yamazaki |
| 2009/0236981 | A1 | 9/2009 | Chang et al. |
| 2010/0181559 | A1 * | 7/2010 | Nakatani et al. ................ 257/40 |
| 2012/0074435 | A1 * | 3/2012 | Ha et al. ......................... 257/88 |
| 2012/0097928 | A1 * | 4/2012 | Kim et al. ....................... 257/40 |
| 2012/0223342 | A1 * | 9/2012 | Tanada et al. ................... 257/88 |
| 2013/0049028 | A1 * | 2/2013 | Kim et al. ....................... 257/88 |
| 2013/0234115 | A1 * | 9/2013 | Song et al. ...................... 257/40 |

FOREIGN PATENT DOCUMENTS

| KR | 10-2002-0075285 A | 10/2002 |
| KR | 10-2008-0085799 A | 9/2008 |
| KR | 10-2009-0099744 A | 9/2009 |
| WO | WO 2012127400 A1 * | 9/2012 |

* cited by examiner

*Primary Examiner* — Allan R Wilson
(74) *Attorney, Agent, or Firm* — Knobbe, Martens, Olson & Bear, LLP

(57) ABSTRACT

In an aspect, an organic light emitting display device including a first substrate, a first electrode, an organic light emitting display structure, a second electrode and a second substrate is provided.

20 Claims, 8 Drawing Sheets

ORGANIC LIGHT EMITTING DISPLAY DEVICE AND METHOD OF MANUFACTURING THE SAME

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims priority to and the benefit of Korean patent Application No. 10-2013-0055440 filed in the Korean Intellectual Property Office on May 16, 2013, the disclosure of which is incorporated herein by reference in its entirety.

BACKGROUND

1. Field

This disclosure relates to an organic light emitting display device. For example, this disclosure relates to an organic light emitting display device having an improved optical efficiency, and a method of manufacturing the organic light emitting display device ensuring an improved optical efficiency.

2. Description of the Related Technology

An organic light emitting display device displays information such as images, letters and/or characters using a light. The light of the organic light emitting display device is generated by combining holes provided from an anode with electrons provided from a cathode in an organic layer thereof. The organic light emitting display device may ensure relatively large view angle, rapid response speed, small thickness, low power consumption, etc.

For this reason, various organic light emitting display devices having a display function and a mirror function have been researched and developed.

SUMMARY

Some embodiments provide an organic light emitting display device having an improved optical efficiency.

Some embodiments provide a method of manufacturing the organic light emitting display device ensuring an improved optical efficiency.

Some embodiments provide an organic light emitting display device including a first substrate, a first electrode, an organic light emitting display structure, a second electrode and a second substrate. In some embodiments, the first substrate may have a first region and a second region surrounding the first region. In some embodiments, the first electrode may be disposed in the first region of the first substrate. In some embodiments, the organic light emitting display structure may be disposed in the first region of the first substrate and making contact with a first surface of the first electrode. In some embodiments, the organic light emitting display structure may have a width greater than the first electrode. In some embodiments, the second electrode may be disposed in the first region of the first substrate. In some embodiments, the second electrode may be opposite to the first electrode. In some embodiments, the second substrate may be opposite to the first substrate, the second substrate having a reflective member disposed in the second region of the first substrate.

In some embodiments, the first electrode may be patterned in the first region of the first substrate based on a width of the organic light emitting structure.

In some embodiments, the organic light emitting display structure includes a hole injection layer, an organic light emitting layer, an electron injection layer, and a second electrode. In some embodiments, the hole injection layer may be disposed on the first electrode. In some embodiments, the organic light emitting layer may be disposed on the hole injection layer. In some embodiments, the electron injection layer may be disposed on the organic light emitting layer. In some embodiments, the second electrode may be disposed on the electron injection layer. In some embodiments, a width of the first electrode is smaller than a width of at least one of the hole injection layer, the organic light emitting layer and the electron injection layer.

In some embodiments, the organic light emitting display structure further includes an electron transport layer and a hole transport layer. In some embodiments, the electron transport layer may be disposed between the organic light emitting layer and the electron injection layer. In some embodiments, the hole transport layer may be disposed between the hole injection layer and the organic light emitting layer. In some embodiments, a width of the first electrode is smaller than a width of at least one of the electron transport layer and the hole injection layer.

In some embodiments, the second electrode may be patterned in the first region of the first substrate based on the width of the organic light emitting structure.

In some embodiments, the organic light emitting display structure includes a hole injection layer, an organic light emitting layer, an electron injection layer, and a second electrode. In some embodiments, the hole injection layer may be disposed on the first electrode. In some embodiments, the organic light emitting layer may be disposed on the hole injection layer. In some embodiments, the electron injection layer may be disposed on the organic light emitting layer. In some embodiments, the second electrode may be disposed on the electron injection layer. In some embodiments, a width of the second electrode is smaller than a width of at least one of the hole injection layer, the organic light emitting layer and the electron injection layer.

In some embodiments, the organic light emitting display structure further includes an electron transport layer and a hole transport layer. In some embodiments, the electron transport layer may be disposed between the organic light emitting layer and the electron injection layer. In some embodiments, the hole transport layer may be disposed between the hole transport layer and the organic light emitting layer. In some embodiments, a width of the second electrode is smaller than a width of at least one of the electron transport layer and the hole transport layer.

In some embodiments, the first region may be a luminescent region in which the organic light emitting structure is disposed, and the second region is non-luminescent region in which the organic light emitting structure is not disposed.

In some embodiments, the reflective member includes a reflective metal member, the reflective member including at least one selected from the group consisting of aluminum (Al), an alloy containing aluminum, gold (Au), an alloy containing gold, platinum (Pt), an alloy containing platinum, nickel (Ni), an alloy containing nickel, chrome (Cr), an alloy containing chrome, tungsten (W) and an alloy containing tungsten.

Some embodiments provide an organic light emitting display device including a first substrate, a first electrode, an insulating layer pattern, and an organic light emitting display structure. In some embodiments, the first substrate may have a first region and a second region surrounding the first region. The first electrode is disposed in the first region of the first substrate. In some embodiments, the insulating layer pattern may be disposed in the first region of the first substrate. In some embodiments, the insulating layer pattern covers an end portion of the first electrode. In some embodiments, the organic light emitting display structure may be disposed in the first region of the first substrate. In some embodiments, the organic light emitting display structure makes contact with a first surface of the first electrode. In some embodiments, the organic light emitting display structure may have a width greater than the first electrode. In some embodiments, the second electrode may be disposed in the first region of the first substrate. In some embodiments, the second electrode may be opposite to the first electrode. In some embodiments, the second substrate may be opposite to the first substrate. In some embodiments, the second substrate may have a reflective member disposed in the second region of the first substrate.

In some embodiments, the organic light emitting display structure includes a hole injection layer, an organic light emitting layer, an electron injection layer, and a second electrode. In some embodiments, the hole injection layer may be disposed on the first electrode and the insulating layer pattern. In some embodiments, the organic light emitting layer may be disposed on the hole injection layer. In some embodiments, the electron injection layer may be disposed on the organic light emitting layer. In some embodiments, the second electrode may be disposed on the electron injection layer. In some embodiments, a width of the first electrode may be smaller than a width of at least one of the hole injection layer, the organic light emitting layer and the electron injection layer.

In some embodiments, the organic light emitting display structure further includes an electron transport layer and a hole transport layer. In some embodiments, the electron transport layer may be disposed between the organic light emitting layer and the electron injection layer. In some embodiments, the hole transport layer may be disposed between the hole injection layer and the organic light emitting layer. In some embodiments, a width of the first electrode may be smaller than a width of at least one of the electron transport layer and the hole transport layer.

In some embodiments, the insulating layer pattern may be disposed in the first region of the first substrate, the insulating layer pattern covering a portion of the second electrode.

In some embodiments, the organic light emitting display structure includes a hole injection layer, an organic light emitting layer, an electron injection layer, an insulating layer pattern, and a second electrode. In some embodiments, the hole injection layer may be disposed on the first electrode. In some embodiments, the organic light emitting layer may be disposed on the hole injection layer. In some embodiments, the electron injection layer may be disposed on the organic light emitting layer. In some embodiments, the insulating layer pattern may be disposed on the electron injection layer. In some embodiments, the second electrode may be disposed on the electron injection layer and the insulating layer pattern. In some embodiments, a width of the second electrode may be smaller than a width of at least one of the hole injection layer, the organic light emitting layer and the electron injection layer.

In some embodiments, the organic light emitting display structure further includes an electron transport layer, a hole transport layer. In some embodiments, the electron transport layer may be disposed between the organic light emitting layer and the electron injection layer. In some embodiments, the hole transport layer may be disposed between the hole injection layer and the organic light emitting layer. In some embodiments, a width of the second electrode may be smaller than a width of at least one of the electron transport layer and the hole transport layer.

In some embodiments, the insulating layer pattern comprises at least one selected from the group consisting of silicon oxide (SiOx), silicon nitride (SiNx), silicon oxynitride (SiOxNy), silicon oxycarbide (SiOxCy) and silicon carbonnitride (SiCxNy). (x, y: natural number)

In some embodiments, the first region is a luminescent region in which the organic light emitting structure is disposed, and the second region is non-luminescent region in which the organic light emitting structure is not disposed.

In some embodiments, the reflective member includes a reflective metal member, the reflective member including at least one selected from the group consisting of aluminum, an alloy containing aluminum, gold, an alloy containing gold, platinum, an alloy containing platinum, nickel, an alloy containing nickel, chrome, an alloy containing chrome, tungsten and an alloy containing tungsten.

Some embodiments provide an organic light emitting display device includes a step of forming a first electrode in a first region of a first substrate, forming an organic light emitting structure disposed in the first region of the first substrate and making contact with a first surface of the first electrode, the organic light emitting display structure having a width greater than the first electrode, forming a second electrode disposed in the first region of the first substrate, the second electrode opposing the first electrode and forming a second substrate opposing the first substrate, the second substrate having a reflective member disposed in the second region of the first substrate.

Some embodiments provide an organic light emitting display device includes a step of forming a first electrode in a first region of a first substrate, forming an insulating layer pattern disposed in the first region of the first substrate, the insulating layer pattern covering an end portion of the first electrode, forming an organic light emitting structure disposed in the first region of the first substrate and making contact with a first surface of the first electrode, the organic light emitting display structure having a width greater than the first electrode, forming a second electrode disposed in the first region of the first substrate, the second electrode opposing the first electrode, and forming a second substrate opposing the first substrate, the second substrate having a reflective member disposed in the second region of the first substrate.

Some embodiments provide an organic light emitting display device including a first substrate having a first region and a second region surrounding the first region and a second substrate opposing the first substrate, the second substrate having a reflective member disposed in the second region of the first substrate. In some embodiments, the organic light emitting display device may perform a display function and a mirror function. In some embodiments, the organic light emitting display device may include a first electrode patterned in the first region of the first substrate based on a width of an organic light emitting structure. As a result, the organic light emitting display device according to embodiments as disclosed and described herein may have an improved optical efficiency.

BRIEF DESCRIPTION OF THE DRAWINGS

Illustrative embodiments will be more clearly understood from the following detailed description taken in conjunction with the accompanying drawings.

DETAILED DESCRIPTION

Figure 1:
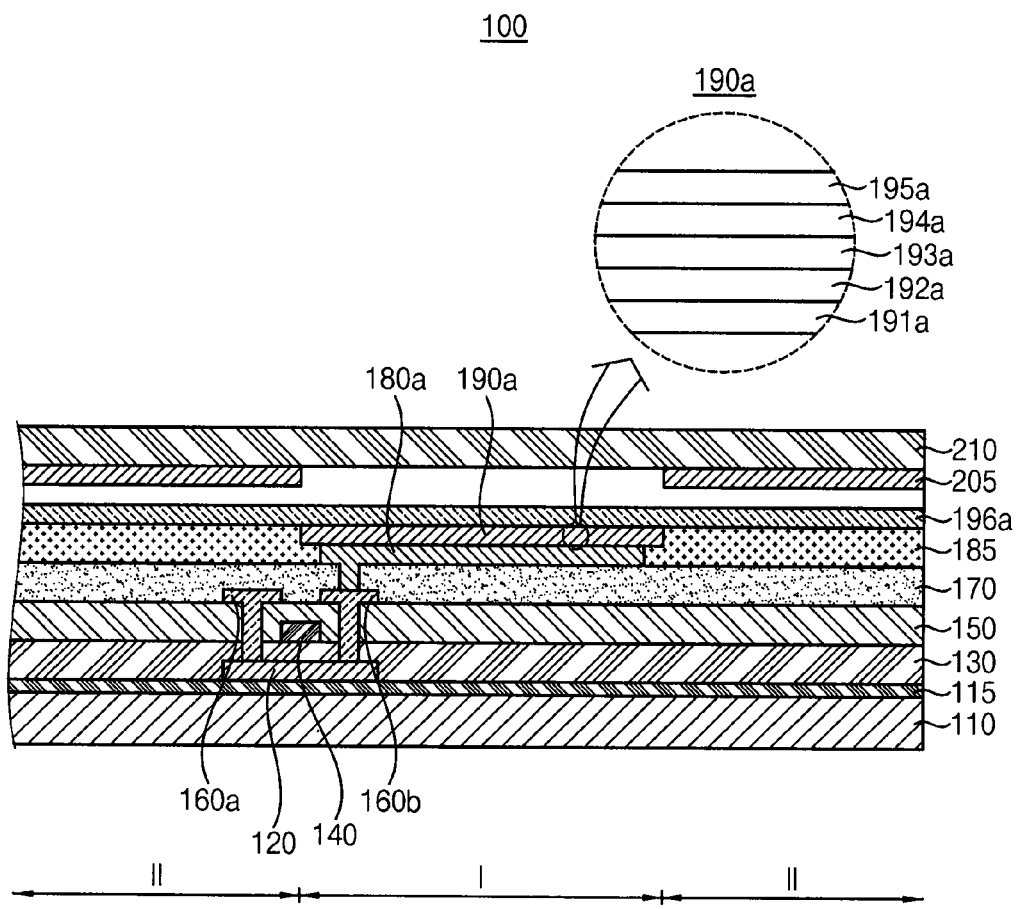
FIG. 1 is a cross-sectional view illustrating an organic light emitting display device in accordance with embodiments of the present disclosure.

Various embodiments will be described more fully hereinafter with reference to the accompanying drawings, in which some embodiments are shown. The present disclosure may be embodied in many different forms and should not be construed as limited to the embodiments set forth herein. Rather, these embodiments are provided so that this disclosure will be thorough and complete, and will fully convey the scope of the present embodiments to those skilled in the art. In the drawings, the widths and relative widths of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the embodiments disclosed and described herein. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating an organic light emitting display device in accordance with embodiments of the present disclosure.

Referring to FIG. 1, an organic light emitting display device 100 may include a first substrate 110, a buffer layer 115, a gate insulating layer 130, a first insulating layer 150, a second insulating layer 170, a pixel defining layer 185, a switching structure, a first electrode 180a, an organic light emitting structure 190a, a second electrode 196a, a reflective member 205, a second substrate 210, etc. where the switching structure may include a semiconductor layer pattern 120, a portion of the gate insulating layer 130, a gate electrode 140, a source electrode 160a, and a drain electrode 160b.

In some embodiments, the first substrate 110 may include a first region I and a second region II surrounding the first region I. For example, the second region II may substantially surround at least one side of the first region I. In some embodiments, the first region I may be a luminescent region in which the organic light emitting structure 190a is disposed, and the second region II may be non-luminescent region in which the organic light emitting structure 190a is not disposed.

In some embodiments, the first substrate 110 may include a glass substrate, a quartz substrate, a transparent plastic substrate, a transparent ceramic substrate, etc. In some embodiments, the first substrate 110 may include a flexible substrate.

In some embodiments, a buffer layer 115 may be disposed on the first substrate 110. In example embodiments, the buffer layer 115 may prevent diffusion of metal atoms and/or impurities from the first substrate 110. In some embodiments, the buffer layer 115 may adjust heat transfer rate of a subsequent crystallization process for a semiconductor layer pattern 120, thereby ensuring the substantially uniform the semiconductor layer pattern 120. In case that the first substrate 110 may have a relatively irregular surface, the buffer layer 115 may improve flatness of the surface of the first substrate 110.

In some embodiments, the buffer layer 115 may be formed using a silicon compound. In some embodiments, the buffer layer 115 may include silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof. (x, y: natural number) In some embodiments, the buffer layer 115 may have a single layer structure or a multilayer structure. For example, the buffer layer 115 may have a single layer structure including a silicon oxide film, a silicon nitride film, a silicon oxynitride film, a silicon oxycarbide film, or a silicon carbon nitride film. In some embodiments, the buffer layer 115 may have a multilayer structure including at least two of a silicon oxide film, a silicon nitride film, a silicon oxynitride film, a silicon oxycarbide film, a silicon carbon nitride film, etc.

When the organic light emitting display device 100 has an active matrix type, the organic light emitting display device 100 may include the switching structure disposed on the first substrate 110. For example, the switching structure may include a thin film transistor. When the switching structure includes a thin film transistor, the switching structure may include the semiconductor layer pattern 120, a gate insulating layer 130, a gate electrode 140, a source electrode 160a, a drain electrode 160b, etc. as shown in FIG. 1.

In some embodiments, the organic light emitting structure 190a may be disposed on the switching structure in the first region I and may be electrically connected to a first surface of the first electrode 180a. In this case, the first electrode 190 may make contact with the drain electrode 160b.

In some embodiments, the first electrode 180a may be patterned in the first region I of the first substrate 110 based on a width of the organic light emitting structure 190a. Accordingly, the first electrode 180a may have a width smaller than the organic light emitting structure 190a. In this case, the first electrode 180a may be patterned in the first region I of the first substrate 110 by a photolithography process or an etching process using an additional etching mask. In some embodiments, the second electrode 196a may be patterned in the first region I of the first substrate 110 based on a width of the organic light emitting structure 190a. Accordingly, the second electrode 196a may have a width smaller than the organic light emitting structure 190a. In this case, the second electrode 196a may be patterned in the first region I of the first substrate 110 by the photolithography process or the etching process using the additional etching mask.

The organic light emitting structure 190a may include a plurality of organic layers. For example, the organic light emitting structure 190a may include a hole injection layer 191a disposed on the first electrode 180a, an organic light emitting layer 193a disposed on the hole injection layer 191a, an electron injection layer 195a disposed on the organic light emitting layer 193a, etc.

In some embodiments, a width of the first electrode 180a may be smaller than a width of at least one of the hole injection layer 191a, the organic light emitting layer 193a and the electron injection layer 195a. In some embodiments, a width of the second electrode 196a may be smaller than a width of at least one of the hole injection layer 191a, the organic light emitting layer 193a and the electron injection layer 195a.

In some embodiments, the organic light emitting structure 190a may further include an electron transport layer 194a disposed between the organic light emitting layer 193a and the electron injection layer 195a and a hole transport layer 192a disposed between the hole injection layer 191a and the organic light emitting layer 193a.

In some embodiments, a width of the first electrode 180a may be smaller than a width of at least one of the electron transport layer 194a and the hole transport layer 192a. In some embodiments, a width of the second electrode 196a may be smaller than a width of at least one of the electron transport layer 194a and the hole transport layer 192a.

In some embodiments, a plurality of organic light emitting layers may be formed using light emitting materials for generating different colors of light such as a red color of light (R), a green color of light (G) and a blue color of light (B) in accordance with color pixels of the organic light emitting display device 100. In some embodiments, the organic light emitting layer of the organic light emitting structure 190a may include a plurality of stacked light emitting materials for generating a red color of light, a green color of light, and a blue color of light to thereby emitting a white color of light.

In some embodiments, the second substrate 210 may be positioned above the first substrate 110. That is, the second substrate 210 may substantially oppose the first substrate 110. In some embodiments, the second substrate 210 may include a transparent insulating substrate. For example, the second substrate 210 may include a glass substrate, a quartz substrate, a transparent resin substrate, etc. In some embodiments, the second substrate 210 may protect the switching structure and the organic light emitting structure 190a from external impact, external environment, etc.

In some embodiments, the second substrate 210 may include the reflective member 205 in a region corresponding to the second region II of the first substrate 110. In some embodiments, the reflective member 205 may include a reflective metal member. For example, the reflective metal member may include at least one selected from the group consisting of aluminum (Al), an alloy containing aluminum, gold (Au), an alloy containing gold, platinum (Pt), an alloy containing platinum, nickel (Ni), an alloy containing nickel, chrome (Cr), an alloy containing chrome, tungsten (W) and an alloy containing tungsten. In some embodiments, the reflective member 205 may reflect light provided to the organic light emitting display device 100. Accordingly, the organic light emitting display device 100 having the reflective member 205 may perform a mirror function while the organic light emitting structure 190a may not emit light.

Since a conventional organic light emitting display device having a mirror function includes a reflective member that partially covers an upper portion of a light luminescent region, the organic light emitting display device may prevent scattered reflection in the light luminescent region. However, light loss may occur due to the position of the reflective member since the reflect member blocks the light generated from the light luminescent region.

In order to prevent light loss, the organic light emitting display device 100 according to some embodiments may include the first electrode 180a patterned in the first region I of the first substrate 110 based on a width of the organic light emitting structure 190a. Accordingly, the organic light emitting display device 100 according to some embodiments may prevent the light loss due to the position of the reflective member. In some embodiments, a width of the first electrode 180a may be smaller than a width of the organic light emitting structure 190a, so that providing holes may be inhibited and light loss may be prevented. As a result, the organic light emitting display device 100 according to some embodiments may have an improved optical efficiency. Additionally, the organic light emitting display device 100 according to some embodiments may include the second electrode 196a patterned in the first region I of the first substrate 110 based on a width of the organic light emitting structure 190a. Accordingly, the organic light emitting display device 100 according to some embodiments may prevent the light loss due to the position of the reflective member. In some embodiments, a width of the second electrode 196a may be smaller than a width of the organic light emitting structure 190a, so that providing electrons may be inhibited and light loss may be prevented. As a result, the organic light emitting display device 100 according to some embodiments may have an improved optical efficiency.

Figure 2:
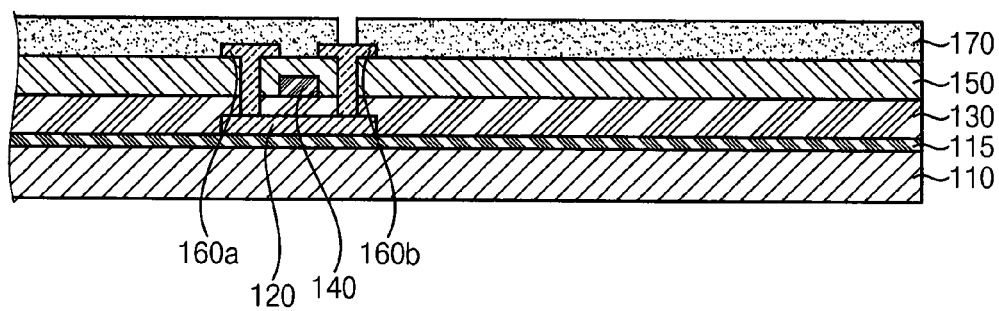
FIGS. 2 to 4B are diagrams illustrating a method of manufacturing an organic light emitting display device of FIG. 1.
Figure 3:
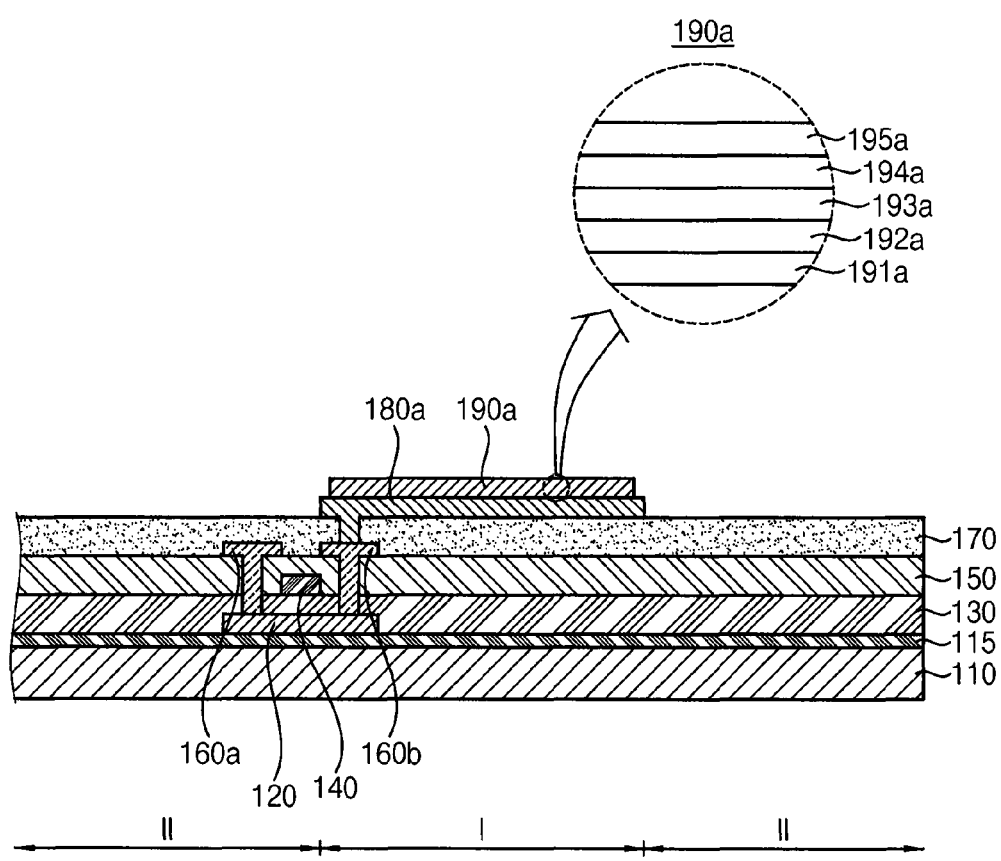
Figure 4A:
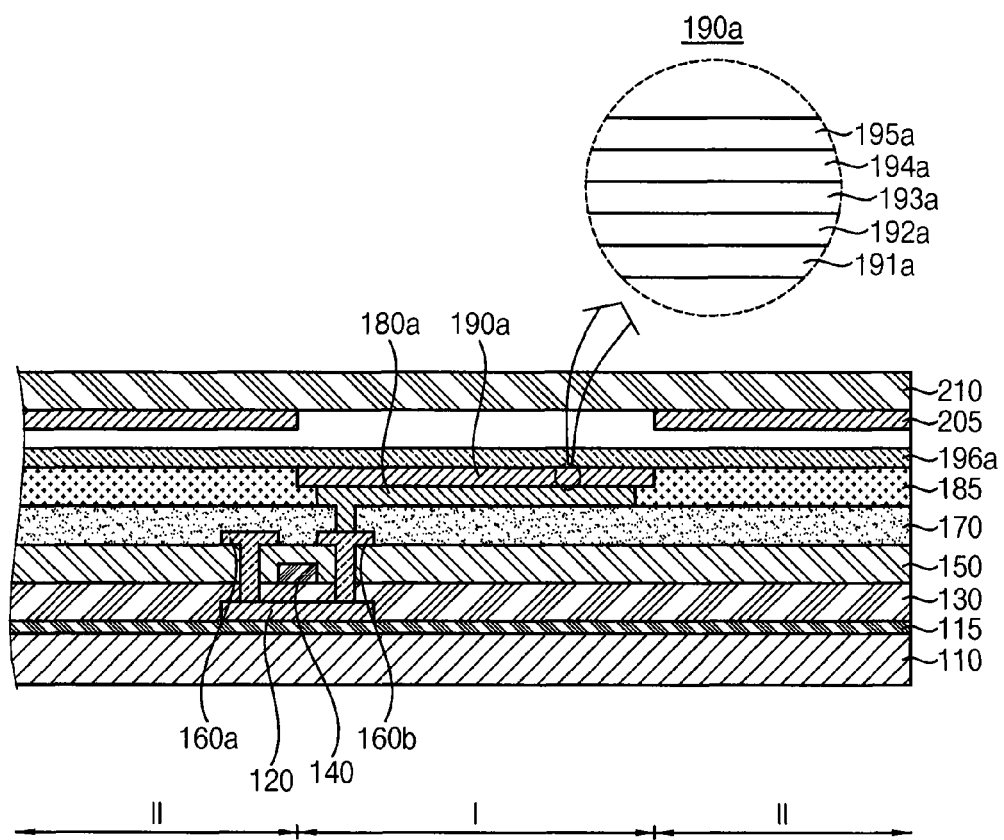
Figure 4B:
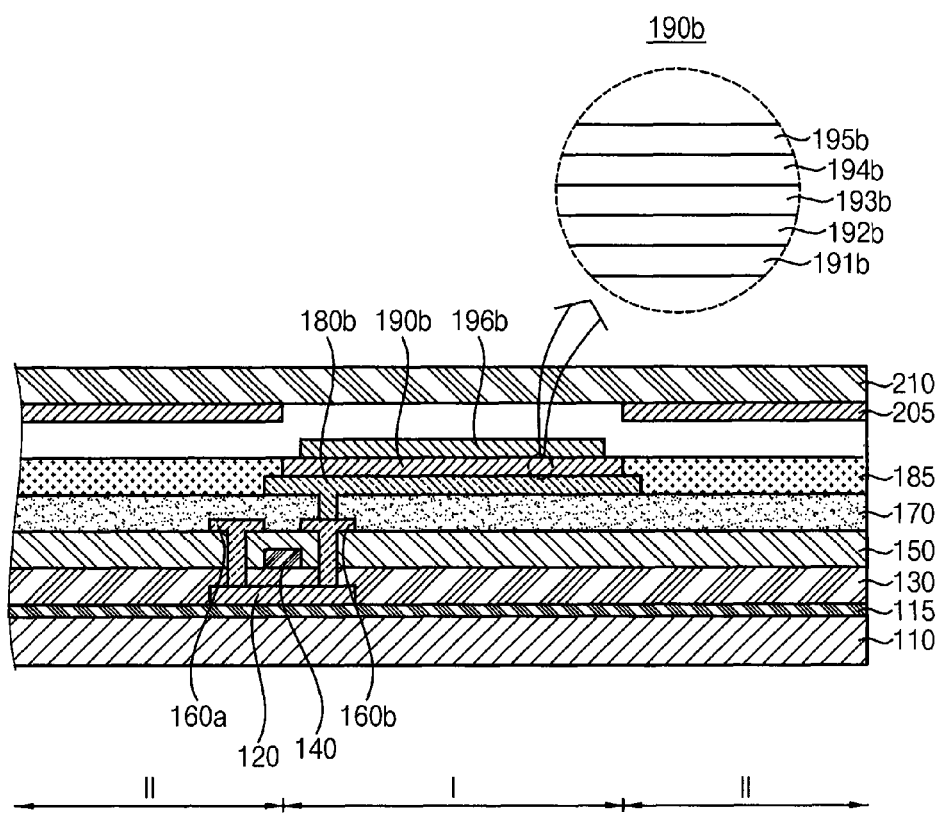

FIGS. 2 to 4B are diagrams illustrating a method of manufacturing an organic light emitting display device of FIG. 1, and FIGS. 4A and 4B are diagrams illustrating a method of manufacturing an organic light emitting display device of FIG. 1.

FIG. 2 is a diagram illustrating a method of forming the lower structure of the organic light emitting display device. For example, the lower structure may include a switching structure having a thin film transistor (TFT).

Referring to FIGS. 2 through 4B, a buffer layer 115, a semiconductor layer pattern 120, a gate insulting layer 130, a gate electrode 140, a source electrode 160a, a drain electrode 160b, a first insulating layer 150 and a second insulating layer 170 may be formed on a first substrate 110.

In some embodiments, the first substrate 110 may include a first region I and a second region II surrounding the first region I. For example, the second region II may substantially surround at least one side of the first region I. In some embodiments, the first region I may be a luminescent region in which the organic light emitting structure 190a is disposed, and the second region II may be non-luminescent region in which the organic light emitting structure 190a is not disposed.

In some embodiments, the first substrate 110 may include a transparent insulating substrate, for example, a glass substrate, a quartz substrate, a ceramic substrate, a transparent plastic substrate, etc. In this case, the transparent plastic substrate may include polyimide, acryl, polyethylene terephthalate, polycarbonate, polyacrylate, polyether, etc.

In some embodiments, a planarization process may be executed on the first substrate 110 before forming the buffer layer 115 on the first substrate 110. For example, the first substrate 110 may have a substantially level surface by a chemical mechanical polishing (CMP) process, an etch-back process, etc. In some embodiments, the buffer layer 115 may be not formed on the first substrate 110 according to the flatness of the first substrate 110, etc.

In some embodiments, the buffer layer 115 may prevent diffusion of metal atoms and/or impurities from the first substrate 110. Additionally, the buffer layer 115 may adjust heat transfer rate of a successive crystallization process for a semiconductor layer pattern 120, to thereby obtaining a substantially uniform the semiconductor layer pattern 120. In case that the first substrate 110 may have a relatively irregular surface, the buffer layer 115 may improve flatness of the surface of the first substrate 110.

In some embodiments, the buffer layer 115 may be formed using a silicon compound. For example, the buffer layer 115 may include silicon oxide, silicon nitride, silicon oxynitride, silicon oxycarbide, silicon carbon nitride, etc. These may be used alone or in a mixture thereof. In some embodiments, the buffer layer 115 may be formed by a spin coating process, a chemical vapor deposition (CVD) process, a plasma enhanced chemical vapor deposition (PECVD) process, a high density plasma-chemical vapor deposition (HDP-CVD) process, a printing process, etc. In some embodiments, the buffer layer 115 may have a single layer structure or a multi layer structure. For example, the buffer layer 115 may have a single layer structure including a silicon oxide film, a silicon nitride film, a silicon oxynitride film, a silicon oxycarbide film, or a silicon carbon nitride film. In some embodiments, the buffer layer 115 may have a multi layer structure including at least two of a silicon oxide film, a silicon nitride film, a silicon oxynitride film, a silicon oxycarbide film, a silicon carbon nitride film, etc.

In some embodiments, a semiconductor layer (not illustrated) may be formed on the buffer layer 115, and then a preliminary semiconductor layer pattern (not illustrated) may be formed on the buffer layer 115 by patterning the semiconductor layer. In some embodiments, the crystallization process may be executed on the preliminary semiconductor layer pattern to form the semiconductor layer pattern 120 on the buffer layer 115. In this case, the semiconductor layer may be formed by a CVD process, a PECVD process, a low pressure chemical vapor deposition (LPCVD), a sputtering process, etc. When the semiconductor layer includes amorphous silicon, the semiconductor layer pattern 120 may include polysilicon. In some embodiments, the crystallization process for forming the semiconductor layer pattern 120 may include a laser irradiation process, a thermal treatment process, a thermal process utilizing a catalyst, etc.

In some embodiments, a dehydrogenation process may be performed about the semiconductor layer and/or the preliminary semiconductor layer pattern after forming the semiconductor layer and/or the preliminary active layer on the buffer layer 115. The dehydrogenation process may reduce the hydrogen concentration of the semiconductor layer and/or the preliminary active layer, so that the semiconductor layer pattern 120 may have improved electrical characteristics.

Referring now to FIG. 2, the gate insulating layer 130 may be disposed on the buffer layer 115 to cover the semiconductor layer pattern 120. In some embodiments, the gate insulating layer 130 may be formed by a CVD process, a spin coating process, a PECVD process, a sputtering process, a vacuum evaporation process, a HDP-CVD process, a printing process, etc. In some embodiments, the gate insulating layer 130 may include silicon oxide, metal oxide, etc. Examples of metal oxide in the gate insulating layer 130 may include hafnium oxide (HfOx), aluminum oxide (AlOx), zirconium oxide (ZrOx), titanium oxide (TiOx), tantalum oxide (TaOx), etc. These may be used alone or in a combination thereof (x, y: natural number).

In some embodiments, the gate insulating layer 130 may be uniformly formed on the buffer layer 115 along a profile of the semiconductor layer pattern 120. For example, the gate insulating layer 130 may have a substantially small width, such that a stepped portion may be generated at a portion of the gate insulating layer 130 adjacent to the semiconductor layer pattern 120. In some embodiments, the gate insulating layer 130 may have a relatively large width for sufficiently covering the semiconductor layer pattern 120, so that the gate insulating layer 130 may have a substantially level surface.

In some embodiments, the gate electrode 140 may be formed on the gate insulating layer 130. In some embodiments, the gate electrode 140 may be positioned on a portion of the gate insulating layer 130 under which the semiconductor layer pattern 120 is located.

In some embodiments, a first conductive layer (not illustrated) may be formed on the gate insulating layer 130. Thereafter, the first conductive layer may be partially etched by a photolithography process or an etching process using an additional etching mask. Hence, the gate electrode 140 may be provided on the gate insulating layer 130. In some embodiments, the first conductive layer may be formed by a printing process, a sputtering process, a CVD process, a pulsed laser deposition (PLD) process, a vacuum evaporation process, an ALD process, etc. In some embodiments, the gate electrode 140 may include metal, an alloy, conductive metal oxide, a transparent conductive material, etc. For example, the gate electrode 140 may be formed using aluminum (Al), an alloy containing aluminum, aluminum nitride (AlNx), silver (Ag), an alloy containing silver, tungsten (W), tungsten nitride (WNx), copper (Cu), an alloy containing copper, nickel (Ni), an alloy containing nickel, chrome (Cr), chrome nitride (CrNx), molybdenum (Mo), an alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. (x, y: natural number). These may be used alone or in a combination thereof. In some embodiments, the gate electrode 140 may have a single layer structure or a multilayer structure, which may include a metal film, an alloy film, a metal nitride film, a conductive metal oxide film, and/or a transparent conductive film. Additionally, the gate electrode 140 may have a single layer structure or a multilayer structure, which may include a conductive material, a heat resistance material and/or a transparent conductive material.

In some embodiments, a gate line (not illustrated) may be formed on the gate insulating layer 130 while forming the gate electrode 140 on the gate insulating layer 130. In some embodiments, the gate line may be coupled to the gate electrode 140, and the gate line may be extended on the gate insulating layer 130 along a first direction.

Using the gate electrode 140 as a mask, impurities may be implanted into portions of the semiconductor layer pattern 120, such that a source region (not illustrated) and a drain region (not illustrated) may be formed in the semiconductor layer pattern 120. In some embodiments, the source and the drain regions may be properly obtained by adjusting an applied energy of an ion implantation process for doping the impurities into both of side portions of the semiconductor layer pattern 120. In this case, a central portion of the semiconductor layer pattern 120 may correspond to a channel region (not illustrated) between by the source and the drain regions because the impurities may not be doped into the central portion of the semiconductor layer pattern 120. That is, the channel region of the semiconductor layer pattern 120 may be defined in accordance with the formation of the source and the drain region. Alternatively, a mask (not illustrated) partially exposing the gate insulating layer 130 may be formed on the gate insulating layer 130 adjacent to the gate electrode 140, and then impurities may be implanted into portions of the semiconductor layer pattern 120 using the gate electrode 140 and the mask as implantation masks, thereby forming the source and the drain regions.

In some embodiments, the gate electrode 140 may have a width substantially smaller than a width of the semiconductor layer pattern 120. For example, the width of the gate electrode 140 may be substantially the same as or substantially similar to that of the channel region of the semiconductor layer pattern 120. However, the dimensions of the gate electrode 140 and/or the dimensions of the channel region may vary in accordance with desired electrical characteristics of a switching structure employed in the organic light emitting display device.

Referring now to FIG. 2, a first insulating layer 150 may be formed on the gate insulating layer 130 to cover the gate electrode 140. In some embodiments, the first insulating layer 150 may be conformally formed on the gate insulating layer 130 along a profile of the gate electrode 140, so that a width of the first insulating layer 150 may be substantially uniform. Hence, the first insulating layer 150 may have stepped portions adjacent to the gate electrode 140. In some embodiments, the first insulating layer 150 may include a silicon compound. For example, the first insulating layer 150 may be formed using silicon oxide, silicon nitride, silicon oxynitride, silicon carbon nitride, silicon oxycarbide, etc. These components may be used alone or in a combination thereof. Further, the first insulating layer 150 may have a single layer structure or a multi layer structure, which may include a silicon oxide film, a silicon nitride film, a silicon oxynitride film, a silicon carbon nitride film and/or a silicon oxycarbide film. In some embodiments, the first insulating layer 150 may be obtained by a spin coating process, a CVD process, a PECVD process, a HDP-CVD process, etc. In some embodiments, the first insulating layer 150 may electrically insulate the gate electrode 140 from a source electrode 145 and a drain electrode 150 successively formed.

In some embodiments, the source and the drain electrodes 160*a* and 160*b* may be provided on the first insulating layer 150. In some embodiments, the source and the drain electrodes 160*a* and 160*b* may be separated from each other by a predetermined distance. In some embodiments, the source and the drain electrodes 160*a* and 160*b* may be adjacent to the gate electrode 140. For example, the source and the drain electrodes 160*a* and 160*b* may respectively extend from portions of the first insulating layer 150 positioned over the source and the drain regions to portions of the first insulating layer 150 located on the gate electrode 140. Additionally, the source and the drain electrodes 160*a* and 160*b* may pass through the first insulating layer 150 and may make contact with the source and the drain regions, respectively.

In some embodiments, the first insulating layer 150 may be partially etched to form holes partially exposing the source and the drain regions, and then a second conductive layer (not illustrated) may be formed on the first insulating layer 150 to fill the holes. In some embodiments, the second conductive layer may be patterned to obtain the source and the drain electrode 160*a* and 160*b* as illustrated in FIG. 2. In some embodiments, the second conductive layer may be formed by a sputtering process, a CVD process, a PLD process, a vacuum evaporation process, an atomic layer deposition (ALD) process, a printing process, etc. Each of the source and the drain electrodes 160*a* and 160*b* may include metal, an alloy, metal nitride, conductive metal oxide, a transparent conductive material, etc. For example, each of the source and the drain electrodes 160*a* and 160*b* may be obtained using aluminum, an alloy containing aluminum, aluminum nitride, silver, an alloy containing silver, tungsten, tungsten nitride, copper, an alloy containing copper, nickel, an alloy containing nickel, chrome, chrome nitride, molybdenum, an alloy containing molybdenum, titanium, an alloy containing titanium, titanium nitride, platinum, an alloy containing platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. Each of the source and the drain electrode 160*a* and 160*b* may have a single layer structure or a multi layer structure, which may include a metal film pattern, an alloy film pattern, a metal nitride film pattern, a conductive metal oxide film pattern and/or a transparent conductive material film pattern.

In some embodiments, a data line (not illustrated) may be formed on the first insulating layer 150 while forming the source and the drain electrodes 160*a* and 160*b* on the source and the drain regions. In some embodiments, the data line may extend on the first insulating layer 150 along a second direction. Here, the second direction may be substantially perpendicular to the first direction where the gate line may extend. The data line may make contact with the source electrode 160*a*.

In some embodiments, a protection layer (not illustrated) may be formed on the first insulation layer 140 to cover the source and the drain electrodes 160*a* and 160*b*. In some embodiments, the protection layer may have a width sufficiently covering the source and the drain electrodes 160*a* and 160*b*. In some embodiments, the protection layer may include an organic material or an inorganic material. For example, the protection layer may be formed using photoresist, acryl-based resin, polyimide-based resin, polyamide-based resin, siloxane-based resin, resin containing photosensitive carboxyl group, novolak resin, alkali-developable resin, silicon oxide, silicon nitride, silicon oxynitride, silicon oxycarbide, silicon carbon nitride, aluminum, magnesium, zinc, hafnium, titanium, tantalum, aluminum oxide, titanium oxide, tantalum oxide, magnesium oxide, zinc oxide, hafnium oxide, zirconium oxide, etc. These components may be used alone or in a combination thereof. In some embodiments, the protection layer may be obtained by a spin coating process, a printing process, a sputtering process, a CVD process, an ALD process, a PECVD process, a HDP-CVD process, a vacuum evaporation process, etc. In some embodiments, the protection layer covering the switching structure may not be formed on the first insulation layer 150 in accordance with ingredients, dimensions and/or structures of a second insulation layer 170 successively formed.

In some embodiments, the second insulation layer 170 may be formed on the protection layer. In some embodiments, the second insulation layer 170 may have a single layer structure or a multi layer structure including at least two insulation films. In some embodiments, a planarization process may be executed about the second insulation layer 170 to improve a flatness of the second insulation layer 170. For example, the second insulation layer 170 may have a substantially level surface by a chemical vapor deposition process and/or an etch back process. In some embodiments, the second insulation layer 170 may include an organic material. For example, the second insulation layer 170 may be formed using photoresist, acryl-based resin, polyimide-based resin, polyamide-based resin, siloxane-based resin, resin containing photosensitive carboxyl group, novolak resin, an alkali-developable resin. These may be used alone or in a combination thereof. In some embodiments, the second insulation layer 170 may be obtained using an inorganic material such as a silicon compound, metal, metal oxide, etc. For example, the second insulation layer 170 may include silicon oxide, silicon nitride, silicon oxynitride, silicon oxycarbide, silicon carbon nitride, aluminum, magnesium, zinc, hafnium, titanium, tantalum, aluminum oxide, titanium oxide, tantalum oxide, magnesium oxide, zinc oxide, hafnium oxide, zirconium oxide, etc. These may be used alone or in a combination thereof. In some embodiments, the second insulation layer 170 may be formed on the protection layer by a spin coating process, a printing process, a sputtering process, a CVD process, an ALD process, a PECVD process, a HDP-CVD process, a vacuum evaporation process, etc.

In some embodiments, the second insulation layer 170 and the protection layer may be partially etched by a photolithography process or an etching process using an additional etching mask, so that a contact hole partially exposing the drain electrode 160b may be formed through the second insulation layer 170 and the protection layer.

By performing the above-described processes, the lower structure including the first substrate 110 and the switching structure may be obtained. As described above, the switching structure may include the TFT including a semiconductor layer pattern 120, the gate insulation layer 130, the gate electrode 140, the source electrode 160a and the drain electrode 160b. In some embodiments, the TFT may be P-type or N-type metal oxide semiconductor (MOS) transistors according to the types of the impurities implanted into the preliminary semiconductor layer pattern. In some embodiments, the switching structure may include an oxide semiconductor device. For example, a gate electrode and a gate insulation layer may be formed on the first substrate 110, and a semiconductor layer pattern may be formed on the gate insulation layer using a semiconductor oxide.

FIG. 3 is cross-sectional views illustrating a method of forming the organic light emitting structure 190a on the first structure obtained by the processes illustrated with reference to FIG. 2.

Referring to FIG. 3, a first electrode 180a electrically connected with the drain electrode 160b may be formed on the second insulating layer 170. In some embodiments, the second insulating layer 170 may be partially removed to form a contact hole exposing at least a portion of the drain electrode 160b. In some embodiments, a third conductive layer (not illustrated) sufficiently filling the contact hole may be formed on the second insulating layer 170 and the drain electrode 160b. In some embodiments, the third conductive layer may be patterned to form the first electrode 180a. In some embodiments, the third conductive layer may be formed using a transparent conductive material including, e.g., indium tin oxide, zinc tin oxide, zinc oxide, tin oxide, etc., or a metal including, e.g., chrome, aluminum, tantalum, molybdenum, titanium, tungsten, copper, silver, neodymium, etc., or an alloy of these materials. In some embodiments, the third conductive layer may be obtained by a sputtering process, a CVD process, an ALD process, a vacuum evaporation process, a printing process, etc. The first electrode 180a may serve as an anode providing holes. Alternatively, the first electrode 180a may have a multi-layered structure including a transparent conductive material layer and a metal layer. In some embodiments, the first electrode 180a may be patterned in the first region of the first substrate 110 based on a width of an organic light emitting structure successively formed.

In some embodiments, a pixel defining layer 185 may be disposed on the first electrode 180a and the second insulating layer 170. In some embodiments, the pixel defining layer 185 may include an organic material or an inorganic material. For example, the pixel defining layer 185 may be formed using photoresist, acryl-based resin, polyacryl-based resin, polyimide-based resin, a silicon compound, etc. In some embodiments, the pixel defining layer 185 may be formed by a spin coating process, a spray process, a printing process, a CVD process, etc. In some embodiments, the pixel defining layer 185 may be partially etched to form an opening partially exposing the first electrode 180a. In some embodiments, the opening of the pixel defining layer 185 may define a luminescent region and a non-luminescent region of the display device. For example, a portion having the opening of the pixel defining layer 185 may be the luminescent region of the display device while another portion around the opening of the pixel defining layer 185 may be the non-luminescent region of the display device.

Referring now to FIG. 3, the organic light emitting structure 190a may be positioned on the first electrode 180a exposed by the opening of the pixel defining layer 185. In example embodiments, the first electrode 180a may be patterned in a first region I of the first substrate 110 based on a width of the organic light emitting structure 190a. Accordingly, the first electrode 180a may have a width smaller than the organic light emitting structure 190a. In this case, the first electrode 180a may be patterned in the first region I of the first substrate 110 by a photolithography process or an etching process using an additional etching mask.

In some embodiments, the organic light emitting structure 190a may include a plurality of organic layers. For example, the organic light emitting structure 190a may include a hole injection layer 191a disposed on the first electrode 180a, an organic light emitting layer 193a disposed on the hole injection layer 191a, an electron injection layer 195a disposed on the organic light emitting layer 193a, etc. In this case, a width of the first electrode 180a may be smaller than a width of at least one of the hole injection layer 191a, the organic light emitting layer 193a and the electron injection layer 195a. In some embodiments, the organic light emitting structure 190a may further include an electron transport layer 194a disposed between the organic light emitting layer 193a and the electron injection layer 195a and a hole transport layer 192a disposed between the hole injection layer 191a and the organic light emitting layer 193a. In example embodiments, a width of the first electrode 180a may be smaller than a width of at least one of the electron transport layer 194a and the hole transport layer 192a. For example, a plurality of organic light emitting layers may be formed using light emitting materials for generating different colored light such as a red colored light (R), a green colored light (G) and a blue colored light (B) in accordance with color pixels of the organic light emitting display device 100.

The second electrode 196a may be disposed on the pixel defining layer 185 and the organic light emitting structure 190a. In some embodiments, the second electrode 196a may serve as a cathode providing electrons. For example, the second electrode 196a may be formed using zinc oxide, indium tin oxide, tin oxide, indium oxide, gallium oxide, indium zinc oxide, etc. These components may be used alone or in a combination thereof. In some embodiments, the second electrode 196a may be formed by a sputtering process, a CVD process, an ALD process, a PLD process, a printing process, etc.

As illustrated in FIG. 4B, the second electrode 196b may be patterned in the first region I of the first substrate 110 based on a width of the organic light emitting structure 190b. In this case, the second electrode 196b may be patterned in the first region I of the first substrate 110 by the photolithography process or the etching process using the additional etching mask. Accordingly, the second electrode 196b may have a width smaller than the organic light emitting structure 190a. For example, a width of the second electrode 196b may be smaller than a width of at least one of the hole injection layer 191b, the organic light emitting layer 193b and the electron injection layer 195b. Furthermore, a width of the second electrode 196b may be smaller than a width of at least one of the electron transport layer 194b and the hole transport layer 192b.

As illustrated in FIGS. 4A and 4B, the second substrate 210 may be positioned over the first substrate 110. In some embodiments, the second substrate 210 may include a glass substrate, a quartz substrate, a transparent plastic substrate, a transparent ceramic substrate, etc. In some embodiments, the second substrate 210 may include a flexible substrate. In some embodiments, the second substrate 210 and the first substrate 110 may include substantially the same materials. However, the present embodiments are not limited thereto. For example, the second substrate 210 and the first substrate 110 may include different materials.

In some embodiments, the second substrate 210 may include the reflective member 205 in a region corresponding to a second region II of the first substrate 110. In some embodiments, the reflective member 205 may include a reflective metal member including at least one selected from the group consisting of aluminum, an alloy containing aluminum, gold, an alloy containing gold, platinum, an alloy containing platinum, nickel, an alloy containing nickel, chrome, an alloy containing chrome, tungsten and an alloy containing tungsten. In some embodiments, the reflective member 205 may reflect light provided to the organic light emitting display device 100. Accordingly, the organic light emitting display device 100 having the reflective member 205 may perform a mirror function while the organic light emitting structures 190a and 190b may not emit light. Additionally, the organic light emitting display device 100 may include the first electrodes 180a and 180b and/or the second electrodes 196a and 196b that are patterned in the first region I of the first substrate 110 based on each of widths of the organic light emitting structures 190a and 190b. As a result, the organic light emitting display device 100 may have an improved optical efficiency.

Figure 5:
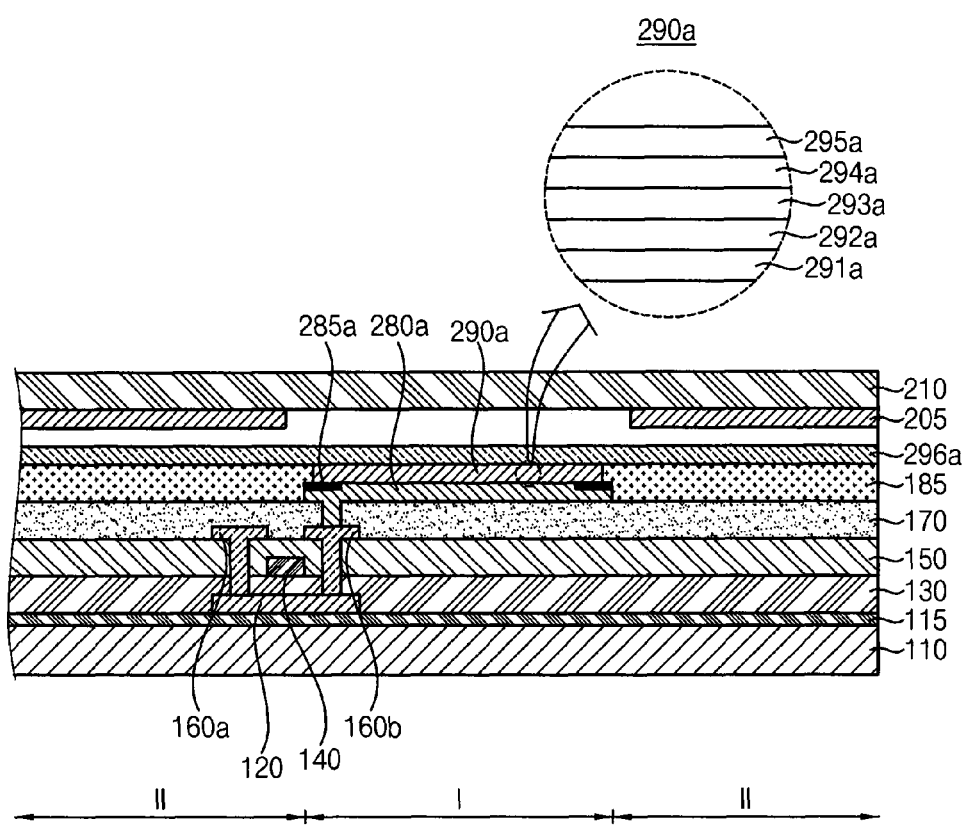
FIG. 5 is a cross-sectional view illustrating an organic light emitting display device in accordance with embodiments of the present disclosure.

FIG. 5 is a cross-sectional view illustrating an organic light emitting display device in accordance with embodiments of the present disclosure. Since the organic light emitting display device 200 of FIG. 5 has a structure substantially the same as or substantially similar to the organic light emitting display device 100 of FIG. 1 except for a first electrode 280a, an organic light emitting structure 290a and an insulating layer pattern 285a, duplicated descriptions will be omitted below.

Referring to FIG. 5, an organic light emitting display device 200 may include a first substrate 110, a first electrode 280a, an insulating layer pattern 285a, an organic light emitting structure 290a, a second electrode 196a second electrode 296, a reflective member 205, a second substrate 210, etc.

In some embodiments, the first substrate 110 may include a first region I and a second region II surrounding the first region I. For example, the second region II may substantially surround at least one side of the first region I. In some embodiments, the first region I may be a luminescent region in which the organic light emitting structure 290a is disposed, and the second region II may be non-luminescent region in which the organic light emitting structure 290a is not disposed. In some embodiments, the first substrate 110 may include a glass substrate, a quartz substrate, a transparent plastic substrate, a transparent ceramic substrate, etc. In some embodiments, the first substrate 110 may include a flexible substrate.

In some embodiments, a buffer layer 115 may be disposed on the first substrate 110. In some embodiments, the buffer layer 115 may prevent diffusion of metal atoms and/or impurities from the first substrate 110. Additionally, the buffer layer 115 may adjust heat transfer rate of a subsequent crystallization process for a semiconductor layer pattern 120, thereby ensuring the substantially uniform the semiconductor layer pattern 120. In case that the first substrate 110 may have a relatively irregular surface, the buffer layer 115 may improve flatness of the surface of the first substrate 110.

In some embodiments, the buffer layer 115 may be formed using a silicon compound. For example, the buffer layer 115 may include silicon oxide, silicon nitride, silicon oxynitride, silicon oxycarbide, silicon carbon nitride, etc. These may be used alone or in a mixture thereof. In some embodiments, the buffer layer 115 may have a single layer structure or a multilayer structure. For example, the buffer layer 115 may have a single layer structure including a silicon oxide film, a silicon nitride film, a silicon oxynitride film, a silicon oxycarbide film, or a silicon carbon nitride film. In some embodiments, the buffer layer 115 may have a multilayer structure including at least two of a silicon oxide film, a silicon nitride film, a silicon oxynitride film, a silicon oxycarbide film, a silicon carbon nitride film, etc.

When the organic light emitting display device 200 has an active matrix type, the organic light emitting display device 200 may include the switching structure disposed on the first substrate 110. For example, the switching structure may include a thin film transistor. When the switching structure includes a thin film transistor, the switching structure may include the semiconductor layer pattern 120, a gate insulating layer 130, a gate electrode 140, a source electrode 160a, a drain electrode 160b, etc.

In some embodiments, the organic light emitting structure 290a may be disposed the switching structure in the first region I and may be electrically connected to a first surface of the first electrode 280a.

In some embodiments, the insulating layer pattern 285a may be formed in the first region I of the first substrate 110 that covers an end portion of the first electrode 280a. Accordingly, the first electrode 280a may have a width smaller than the organic light emitting structure 290a. In some embodiments, the insulating layer pattern 285a may be formed in the first region I of the first substrate 110 that covers a portion of the second electrode 296a. Accordingly, the second electrode 296a may have a width smaller than the organic light emitting structure 290a. For example, the insulating layer pattern 285a may include at least one of silicon oxide, silicon nitride, silicon oxynitride, silicon oxycarbide and silicon carbonnitride.

The organic light emitting structure 290a may include a plurality of organic layers. For example, the organic light emitting structure 290a may include a hole injection layer 291a disposed on the first electrode 280a, an organic light emitting layer 293a disposed on the hole injection layer 291a, an electron injection layer 295a disposed on the organic light emitting layer 293a, etc.

In some embodiments, a width of the first electrode 280a may be smaller than a width of at least one of the hole injection layer 291a, the organic light emitting layer 293a and the electron injection layer 295a. In some embodiments, a width of the second electrode 296a may be smaller than a width of at least one of the hole injection layer 291a, the organic light emitting layer 293a and the electron injection layer 295a.

In some embodiments, the organic light emitting structure 290a may further include an electron transport layer 294a disposed between the organic light emitting layer 293a and the electron injection layer 295a and a hole transport layer 292a disposed between the hole injection layer 291a and the organic light emitting layer 293a.

In some embodiments, a width of the first electrode 280a may be smaller than a width of at least one of the electron transport layer 294a and the hole transport layer 292a. In some embodiments, a width of the second electrode 296a may be smaller than a width of at least one of the electron transport layer 294a and the hole transport layer 292a.

In some embodiments, a plurality of organic light emitting layers may be formed using light emitting materials for generating different colors of light such as a red color of light (R), a green color of light (G) and a blue color of light (B) in accordance with color pixels of the organic light emitting display device 100. In some embodiments, the organic light emitting layer of the organic light emitting structure 190a may include a plurality of stacked light emitting materials for generating a red color of light, a green color of light, and a blue color of light to thereby emitting a white color of light.

In some embodiments, the second substrate 210 may be positioned above the first substrate 110. That is, the second substrate 210 may substantially oppose the first substrate 110. In some embodiments, the second substrate 210 may include a transparent insulating substrate. For example, the second substrate 210 may include a glass substrate, a quartz substrate, a transparent resin substrate, etc. In some embodiments, the second substrate 210 may protect the switching structure and the organic light emitting structure 190a from external impact, external environment, etc.

In some embodiments, the second substrate 210 may include the reflective member 205 in a region corresponding to the second region II of the first substrate 110. In some embodiments, the reflective member 205 may include a reflective metal member including at least one selected from the group consisting of aluminum, an alloy containing aluminum, gold, an alloy containing gold, platinum, an alloy containing platinum, nickel, an alloy containing nickel, chrome, an alloy containing chrome, tungsten and an alloy containing tungsten. In some embodiments, the reflective member 205 may reflect light provided to the organic light emitting display device 200. Accordingly, the organic light emitting display device 200 having the reflective member 205 may perform a mirror function while the organic light emitting structure 290a may not emit light.

Since a conventional organic light emitting display device having a mirror function includes a reflective member that partially covers an upper portion of a light luminescent region, the organic light emitting display device may prevent a scattered reflection in the light luminescent region. However, light loss may occur due to the position of the reflective member since the reflect member blocks the light generated from the light luminescent region.

In order to prevent light loss, the organic light emitting display device 200 according to some embodiments may include the insulating layer pattern 285a that covers the end portion of the first electrode 280a as shown in FIG. 5. Accordingly, the organic light emitting display device 200 according to some embodiments may prevent the light loss due to the position of the reflective member. In some embodiments, a width of the first electrode 280a may be smaller than a width of the organic light emitting structure 290a, so that providing holes may be inhibited and light loss may be prevented. As a result, the organic light emitting display device 200 according to some embodiments may have an improved optical efficiency. Additionally, the organic light emitting display device 200 according to some embodiments may include the second electrode 196a second electrode 296 patterned in the first region I of the first substrate 110 based on a width of the organic light emitting structure 290a. Accordingly, the organic light emitting display device 200 according to some embodiments may prevent the light loss due to the position of the reflective member. In some embodiments, a width of the second electrode 296a may be smaller than a width of the organic light emitting structure 290a, so that providing electrons may be inhibited and light loss may be prevented. As a result, the organic light emitting display device 200 may have an improved optical efficiency.

Figure 6:
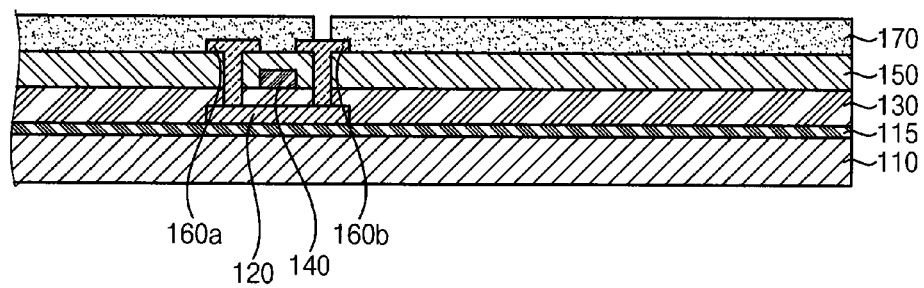
FIGS. 6 to 8B are diagrams illustrating a method of manufacturing an organic light emitting display device of FIG. 5.
Figure 7:
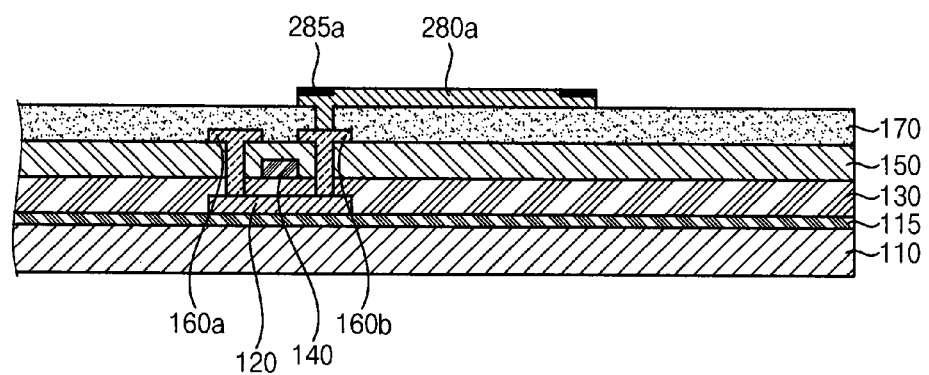
Figure 8A:
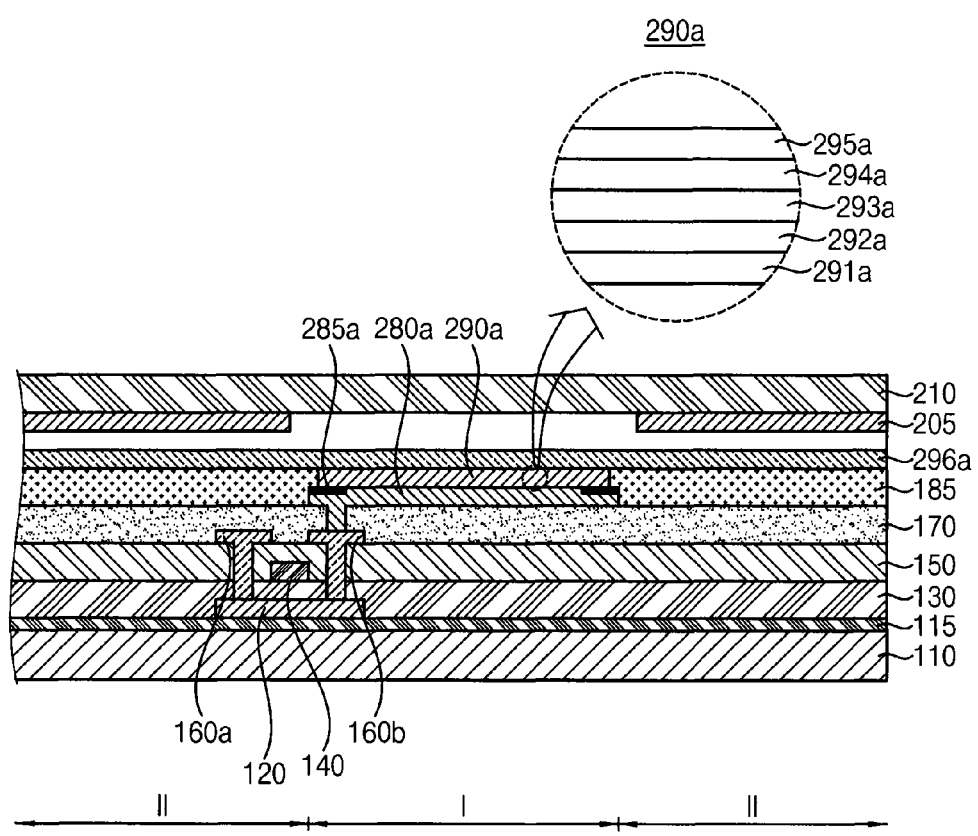
Figure 8B:
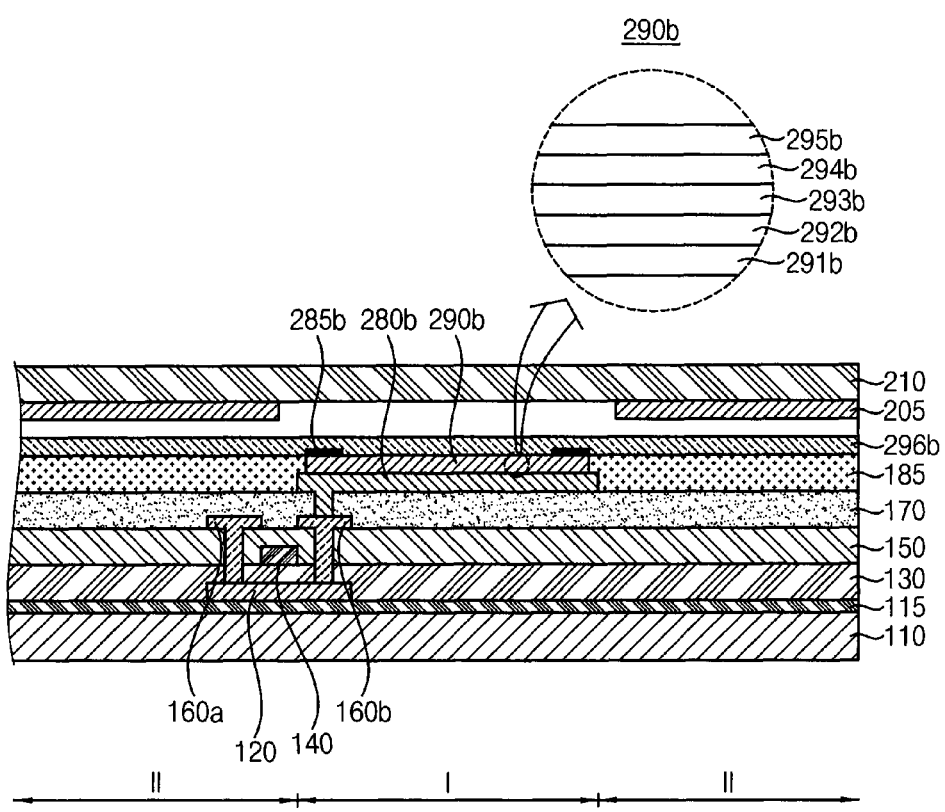

FIGS. 6 to 8B are diagrams illustrating a method of manufacturing an organic light emitting display device of FIG. 5, and FIGS. 8A and 8B are diagrams illustrating a method of manufacturing an organic light emitting display device of FIG. 5.

In FIGS. 6 through 8B, it will be described that a method of manufacturing the organic light emitting display device may be substantially the same as or substantially similar to the organic light emitting display device described above with reference to FIGS. 2 through 4B except for first electrodes 280a and 280b, insulating layer patterns 285a and 285b, organic light emitting structures 290a and 290b, and second electrodes 296a and 296b, however, it will be appreciated by those of ordinary skill in the art that the method of manufacturing the organic light emitting display device illustrated in FIGS. 6 through 8B may be employed in other organic light emitting display devices having various configurations where the first substrate, the first electrode, the insulating layer pattern, the organic light emitting structure, the second electrode, the reflective member, the second substrate, etc. may be disposed in various forms.

By performing the processes the same as or substantially similar to the processes illustrated in FIG. 3, the lower structure including the first substrate 110 and the switching structure may be obtained, duplicated descriptions will be omitted below.

Referring to FIG. 6, a lower structure including a first substrate 110, a buffer layer 115, a semiconductor layer pattern 120, a gate insulating layer 130, a gate electrode 140, a first insulating layer 150, a source electrode 160a, a drain electrode 160b, a second insulating layer 170 are prepared for further processing.

Referring to FIG. 7, a first electrode 280a electrically connected with the drain electrode 160b may be formed on the second insulating layer 170. In some embodiments, the second insulating layer 170 may be partially removed to form a contact hole exposing at least a portion of the drain electrode 160b. In some embodiments, a third conductive layer (not illustrated) sufficiently filling the contact hole may be formed on the second insulating layer 170 and the drain electrode 160b. In some embodiments, the third conductive layer may be patterned to form the first electrode 280a. In some embodiments, the first electrode 280a may serve as an anode providing holes.

Subsequently, a pixel defining layer 185 may be disposed on the first electrode 280a and the second insulating layer 170. For example, the pixel defining layer 185 may be formed by a spin coating process, a spray process, a printing process, a CVD process, etc.

Referring now to FIG. 7, the insulating layer pattern 285a may be formed in the first region I of the first substrate 110 that covers an end portion of the first electrode 280a. Accordingly, the first electrode 280a may have a width smaller than the organic light emitting structure 290a (see FIG. 8A). For example, the insulating layer pattern 285a may include at least one of silicon oxide, silicon nitride, silicon oxynitride, silicon oxycarbide and silicon carbonnitride. In this case, the insulating layer pattern 285a may be patterned in the first region I of the first substrate 110 by a photolithography process or an etching process using an additional etching mask.

Referring to FIG. 8A, the organic light emitting structure 290a may be formed on the first electrode 280a and the insulating layer pattern 285a.

In some embodiments, the organic light emitting structure 290a may include a hole injection layer 291a disposed on the first electrode 280a, an organic light emitting layer 293a disposed on the hole injection layer 291a, an electron injection layer 295a disposed on the organic light emitting layer 293a, etc.

In some embodiments, a width of the first electrode 280a may be smaller than a width of at least one of the hole injection layer 291a, the organic light emitting layer 293a and the electron injection layer 295a.

In some embodiments, the organic light emitting structure 290a may further include an electron transport layer 294a disposed between the organic light emitting layer 293a and the electron injection layer 295a and a hole transport layer 292a disposed between the hole injection layer 291a and the organic light emitting layer 293a.

In some embodiments, a width of the first electrode 280a may be smaller than a width of at least one of the electron transport layer 294a and the hole transport layer 292a.

In some embodiments, the insulating layer pattern 285b may be formed in the first region I of the first substrate 110 that covers a portion of the second electrode 296b. Accordingly, the second electrode 296b may have a width smaller than the organic light emitting structure 290b. For example, a width of the second electrode 296b may be smaller than a width of at least one of the hole injection layer 291b, the organic light emitting layer 293b and the electron injection layer 295b. Furthermore, a width of the second electrode 296b may be smaller than a width of at least one of the electron transport layer 294b and the hole transport layer 292b.

As illustrated in FIGS. 8A and 8B, the second substrate 210 may be positioned over the first substrate 110.

In some embodiments, the second substrate 210 may include the reflective member 205 in a region corresponding to a second region II of the first substrate 110. In some embodiments, the reflective member 205 may include a reflective metal member including at least one selected from the group consisting of aluminum, an alloy containing aluminum, gold, an alloy containing gold, platinum, an alloy containing platinum, nickel, an alloy containing nickel, chrome, an alloy containing chrome, tungsten and an alloy containing tungsten. In some embodiments, the reflective member 205 may reflect light provided to the organic light emitting display device 200. Accordingly, the organic light emitting display device 200 having the reflective member 205 may perform a mirror function while the organic light emitting structures 290a and 290b may not emit light. Additionally, the organic light emitting display device 200 may include the first electrodes 280a and 280b and/or the second electrodes 296a and 296b that are patterned in the first region I of the first substrate 110 based on each of widths of the organic light emitting structures 290a and 290b. As a result, the organic light emitting display device 200 may have an improved optical efficiency.

According to some embodiments, the organic light emitting display device may be an electronic device such as a mobile phone, a smart phone, a laptop computer, a tablet computer, a personal digital assistant (PDA), a portable multimedia player (PMP), a digital camera, a music player, a portable game console, a navigation device, etc.

The foregoing is illustrative of exemplary embodiments and is not to be construed as limiting thereof. Although a few embodiments have been described, those skilled in the art will readily appreciate that many modifications are possible without materially departing from the novel teachings and advantages of the present embodiments. Accordingly, all such modifications are intended to be included within the scope of the present embodiments as defined in the claims. Therefore, it is to be understood that the foregoing is illustrative and is not to be construed as limited to the specific example embodiments disclosed, and that modifications to the disclosed embodiments, as well as other embodiments, are intended to be included within the scope of the appended claims.

What is claimed is:

1. An organic light emitting display device comprising:
   a first substrate having a first region and a second region surrounding the first region;
   a first electrode disposed in the first region of the first substrate, said first electrode having a width;
   an organic light emitting display structure disposed in the first region of the first substrate and making contact with a first surface of the first electrode, the organic light emitting display structure having a width greater than the width of the first electrode;
   a second electrode disposed in the first region of the first substrate, the second electrode opposing the first electrode; and
   a second substrate opposing the first substrate, the second substrate having a reflective member disposed in the second region of the first substrate.

2. The organic light emitting display device of claim 1, wherein the first electrode is patterned in the first region of the first substrate based on a width of the organic light emitting structure.

3. The organic light emitting display device of claim 1, wherein the organic light emitting display structure comprises:
   a hole injection layer disposed on the first electrode;
   an organic light emitting layer disposed on the hole injection layer;
   an electron injection layer disposed on the organic light emitting layer; and
   a second electrode disposed on the electron injection layer, and
   wherein a width of the first electrode is smaller than a width of at least one of the hole injection layer, the organic light emitting layer and the electron injection layer.

4. The organic light emitting display device of claim 3, wherein the organic light emitting structure further comprises:
   an electron transport layer disposed between the organic light emitting layer and the electron injection layer; and
   a hole transport layer disposed between the hole injection layer and the organic light emitting layer, and
   wherein a width of the first electrode is smaller than a width of at least one of the electron transport layer and the hole transport layer.

5. The organic light emitting display device of claim 1, wherein the second electrode is patterned in the first region of the first substrate based on the width of the organic light emitting structure.

6. The organic light emitting display device of claim 5, wherein the organic light emitting display structure comprises:
a hole injection layer disposed on the first electrode;
an organic light emitting layer disposed on the hole injection layer;
an electron injection layer disposed on the organic light emitting layer; and
a second electrode disposed on the electron injection layer, and
wherein a width of the second electrode is smaller than a width of at least one of the hole injection layer, the organic light emitting layer and the electron injection layer.

7. The organic light emitting display device of claim 6, wherein the organic light emitting structure further comprises:
an electron transport layer disposed between the organic light emitting layer and the electron injection layer; and
a hole transport layer disposed between the hole injection layer and the organic light emitting layer, and
wherein a width of the second electrode is smaller than a width of at least one of the electron transport layer and the hole transport layer.

8. The organic light emitting display device of claim 1, wherein the first region is a luminescent region, in which the organic light emitting structure is disposed, and the second region is non-luminescent region in which the organic light emitting structure is not disposed.

9. The organic light emitting display device of claim 1, wherein the reflective member includes a reflective metal member, the reflective member including at least one selected from the group consisting of aluminum (Al), an alloy containing aluminum, gold (Au), an alloy containing gold, platinum (Pt), an alloy containing platinum, nickel (Ni), alloy containing nickel, chrome (Cr), an alloy containing chrome, tungsten (W) and an alloy containing tungsten.

10. An organic light emitting display device comprising:
a first substrate having a first region and a second region surrounding the first region;
a first electrode disposed in the first region of the first substrate;
a insulating layer pattern disposed in the first region of the first substrate, the insulating layer pattern covering an end portion of the first electrode;
an organic light emitting display structure disposed in the first region of the first substrate and making contact with a first surface of the first electrode, the organic light emitting display structure having a width greater than the first electrode;
a second electrode disposed in the first region of the first substrate, the second electrode opposing the first electrode; and
a second substrate opposing the first substrate, the second substrate having a reflective member disposed in the second region of the first substrate.

11. The organic light emitting display device of claim 10, wherein the organic light emitting display structure comprises:
a hole injection layer disposed on the first electrode and the insulating layer pattern;
an organic light emitting layer disposed on the hole injection layer;
an electron injection layer disposed on the organic light emitting layer; and
a second electrode disposed on the electron injection layer, and
wherein a width of the first electrode is smaller a width of at least one of the hole injection layer, the organic light emitting layer and the electron injection layer.

12. The organic light emitting display device of claim 10, wherein the organic light emitting structure further comprises:
an electron transport layer disposed between the organic light emitting layer and the electron injection layer; and
a hole transport layer disposed between the hole injection layer and the organic light emitting layer, and
wherein a width of the first electrode is smaller than a width of at least one of the electron transport layer and the hole transport layer.

13. The organic light emitting display device of claim 10, wherein the insulating layer pattern is disposed in the first region of the first substrate, and the insulating layer pattern covers a portion of the second electrode.

14. The organic light emitting display device of claim 13, wherein the organic light emitting display structure comprises:
a hole injection layer disposed on the first electrode;
an organic light emitting layer disposed on the hole injection layer;
an electron injection layer disposed on the organic light emitting layer;
a insulating layer pattern disposed on the electron injection layer; and
a second electrode disposed on the electron injection layer and the insulating layer pattern; and
wherein a width of the second electrode is smaller than a width of at least one of the hole injection layer, the organic light emitting layer and the electron injection layer.

15. The organic light emitting display device of claim 14, wherein the organic light emitting structure further comprises:
an electron transport layer disposed between the organic light emitting layer and the electron injection layer; and
a hole transport layer disposed between the hole injection layer and the organic light emitting layer, and
wherein a width of the second electrode is smaller than a width of at least one of the electron transport layer and the hole transport layer.

16. The organic light emitting display device of claim 10, wherein the insulating layer pattern comprises at least one selected from the group consisting of silicon oxide (SiOx), silicon nitride (SiNx), silicon oxynitride (SiOxNy), silicon oxycarbide (SiOxCy) and silicon carbonnitride (SiCxNy) (x, y: natural number).

17. The organic light emitting display device of claim 10, wherein the first region is a luminescent region in which the organic light emitting structure is disposed, and the second region is non-luminescent region in which the organic light emitting structure is not disposed.

18. The organic light emitting display device of claim 10, wherein the reflective member includes a reflective metal member, the reflective member including at least one selected from the group consisting of aluminum, an alloy containing aluminum, gold, an alloy containing gold, platinum, an alloy containing platinum, nickel, an alloy containing nickel, chrome, an alloy containing chrome, tungsten and an alloy containing tungsten.

19. A method of manufacturing an organic light emitting display device, the method comprising:
- forming a first electrode in a first region of a first substrate;
- forming an organic light emitting structure disposed in the first region of the first substrate and making contact with a first surface of the first electrode, the organic light emitting display structure having a width greater than the first electrode;
- forming a second electrode disposed in the first region of the first substrate, the second electrode opposing the first electrode; and
- forming a second substrate opposing the first substrate, the second substrate having a reflective member disposed in the second region of the first substrate.

20. A method of manufacturing an organic light emitting display device, the method comprising:
- forming a first electrode in a first region of a first substrate;
- forming an insulating layer pattern disposed in the first region of the first substrate, the insulating layer pattern covering an end portion of the first electrode;
- forming an organic light emitting structure disposed in the first region of the first substrate and making contact with a first surface of the first electrode, the organic light emitting display structure having a width greater than the first electrode;
- forming a second electrode disposed in the first region of the first substrate, the second electrode opposing the first electrode; and
- forming a second substrate opposing the first substrate, the second substrate having a reflective member disposed in the second region of the first substrate.

\* \* \* \* \*